United States Patent
Lin et al.

(10) Patent No.: US 12,408,295 B2
(45) Date of Patent: Sep. 2, 2025

(54) FLUID DISTRIBUTION ASSEMBLY AND COOLING SYSTEM INCLUDING THE SAME

(71) Applicant: WISTRON CORP., New Taipei (TW)

(72) Inventors: Sheng Yen Lin, New Taipei (TW); Cheng Han Chiang, New Taipei (TW)

(73) Assignee: WISTRON CORP., New Taipei (TW)

( * ) Notice: Subject to any disclaimer, the term of this patent is extended or adjusted under 35 U.S.C. 154(b) by 220 days.

(21) Appl. No.: 17/935,141

(22) Filed: Sep. 26, 2022

(65) Prior Publication Data
US 2023/0363107 A1 Nov. 9, 2023

(30) Foreign Application Priority Data
May 6, 2022 (TW) ................................. 111117133

(51) Int. Cl.
H05K 7/20 (2006.01)
(52) U.S. Cl.
CPC ..... H05K 7/20236 (2013.01); H05K 7/20272 (2013.01); H05K 7/20772 (2013.01)

(58) Field of Classification Search
CPC .............. F28D 1/02; F28D 2001/0253; H05K 7/20236; H05K 7/20272; H05K 7/203; H05K 7/20763; H05K 7/20772
See application file for complete search history.

(56) References Cited

U.S. PATENT DOCUMENTS

| | | | |
|---|---|---|---|
| 8,944,151 B2* | 2/2015 | Flotta | H05K 7/20772 165/80.4 |
| 10,271,456 B2 | 4/2019 | Tufty et al. | |
| 11,096,313 B2 | 8/2021 | Amos et al. | |
| 2009/0260777 A1* | 10/2009 | Attlesey | H01L 23/473 165/104.33 |
| 2010/0103362 A1 | 4/2010 | Campbell et al. | |
| 2010/0103620 A1 | 4/2010 | Campbell et al. | |
| 2010/0226094 A1* | 9/2010 | Attlesey | H05K 7/20772 361/699 |
| 2011/0317367 A1* | 12/2011 | Campbell | H05K 7/203 361/700 |
| 2014/0124174 A1* | 5/2014 | Campbell | H05K 7/20809 29/890.035 |

(Continued)

FOREIGN PATENT DOCUMENTS

| | | |
|---|---|---|
| JP | 3639933 U | 6/1991 |
| JP | H0363993 U | 6/1991 |

(Continued)

OTHER PUBLICATIONS

TW Office Action dated Oct. 18, 2022 in Taiwan application No. 111117133.

(Continued)

*Primary Examiner* — Eric S Ruppert
*Assistant Examiner* — Hans R Weiland
(74) *Attorney, Agent, or Firm* — McClure, Qualey & Rodack, LLP

(57) ABSTRACT

A fluid distribution assembly is adapted for at least one heat source and includes at least one housing having a coolant chamber and at least one fluid-driving component in fluid communication with the coolant chamber configured for accommodating the at least one heat source, and the at least one fluid-driving component is configured to pump fluid out of the coolant chamber.

14 Claims, 7 Drawing Sheets

(56) References Cited

U.S. PATENT DOCUMENTS

| | | | | |
|---|---|---|---|---|
| 2019/0054794 A1* | 2/2019 | Wischnesky | ....... | H05K 7/20854 |
| 2020/0107468 A1* | 4/2020 | Archer | ............... | H05K 7/20236 |
| 2020/0305307 A1* | 9/2020 | Amos | ................ | H05K 7/20263 |
| 2022/0201896 A1* | 6/2022 | Edmunds | ........... | H05K 7/20263 |
| 2022/0408609 A1* | 12/2022 | Longhurst | .......... | H05K 7/20236 |
| 2023/0091814 A1* | 3/2023 | Gordon | ............. | H05K 7/20236 |

FOREIGN PATENT DOCUMENTS

| | | |
|---|---|---|
| JP | H03639933 U | 6/1991 |
| TW | 201921225 A | 6/2019 |
| TW | I686578 B | 3/2020 |

OTHER PUBLICATIONS

EP Search Report dated Oct. 9, 2023 in European application No. 22210938.1-1201.

\* cited by examiner

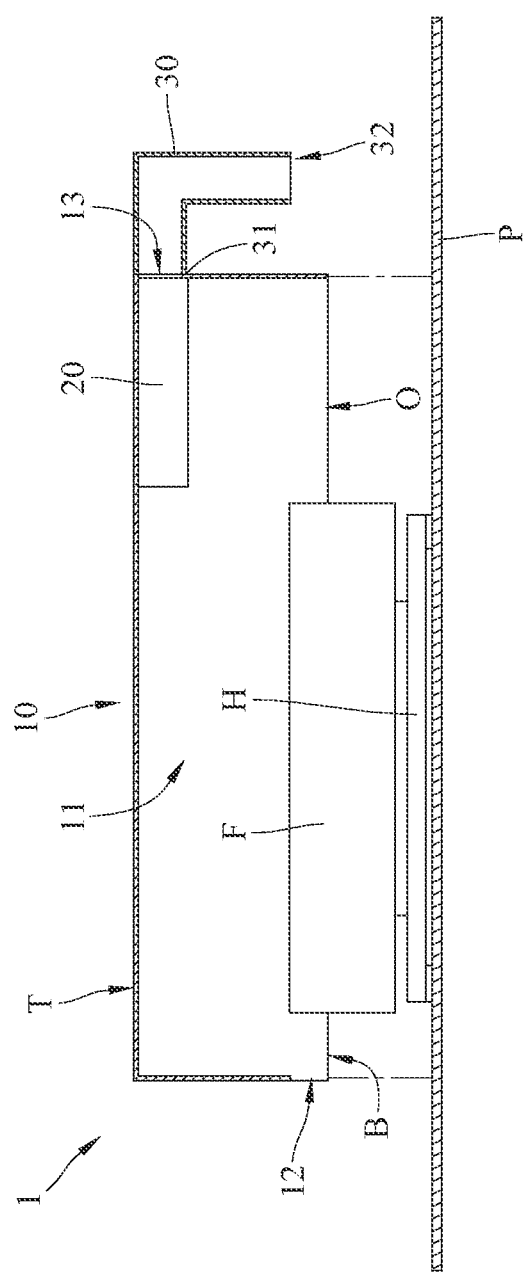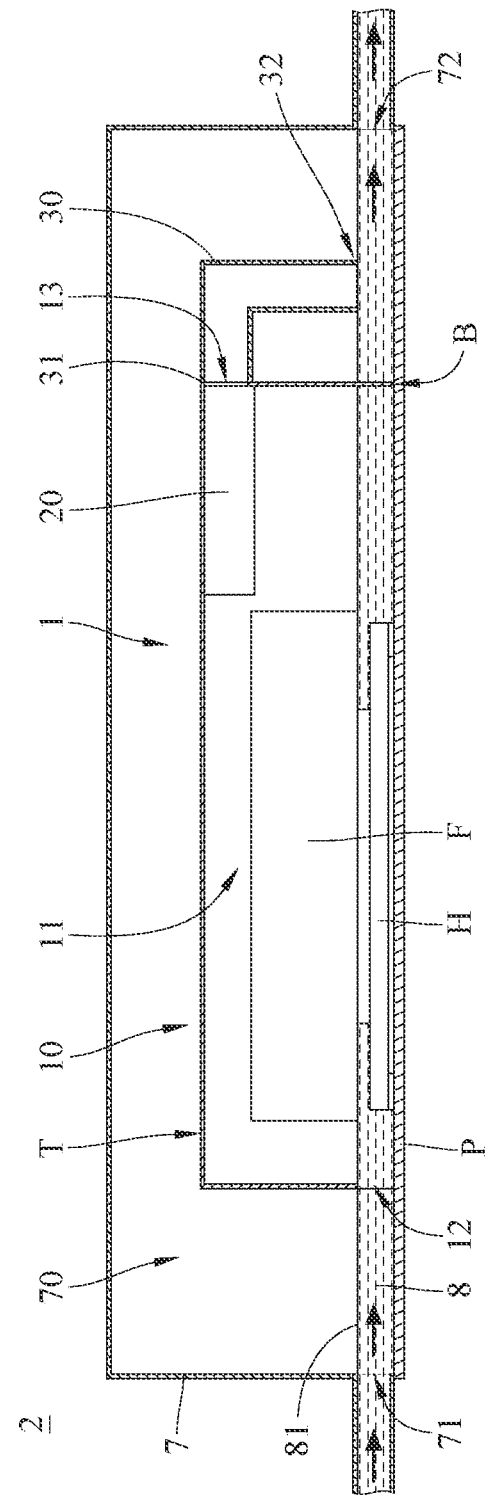

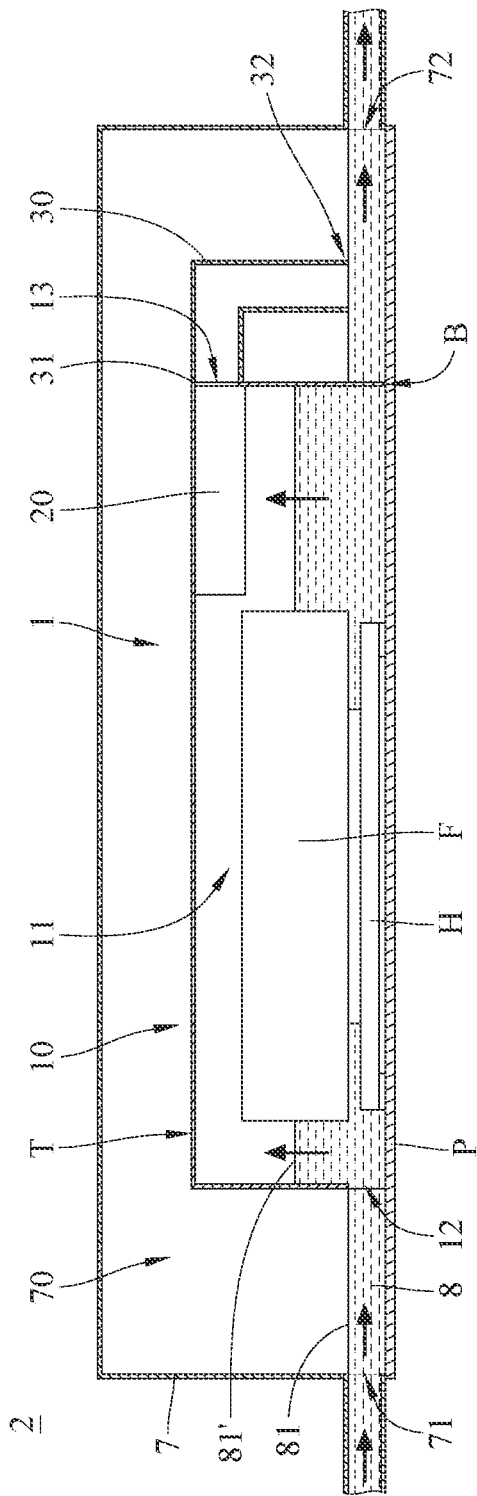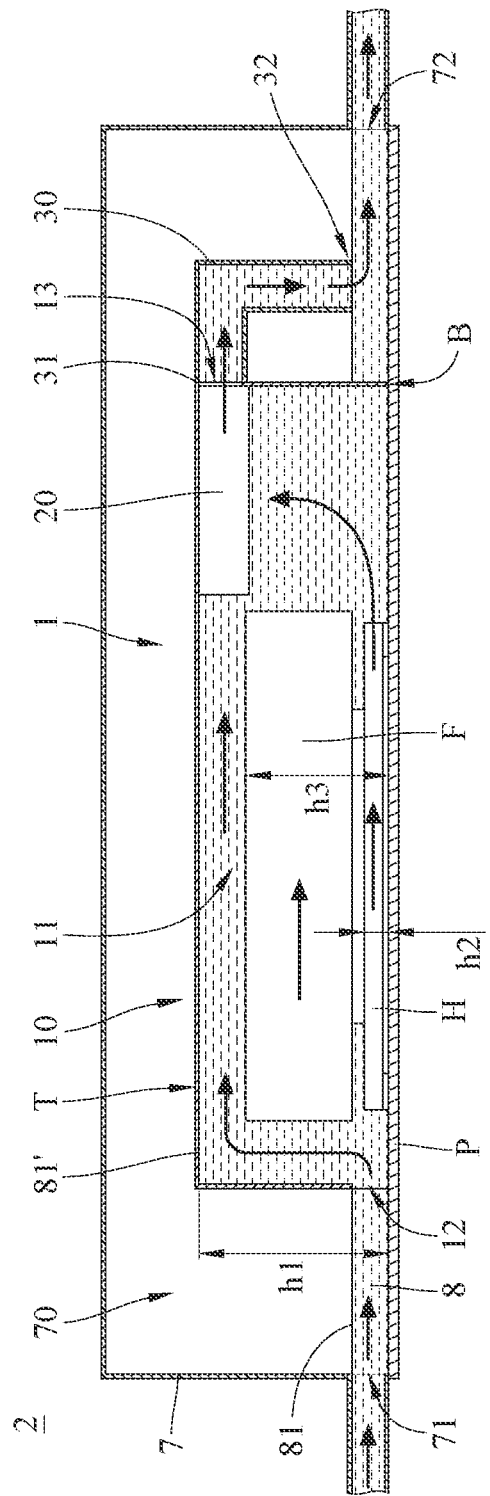

FLUID DISTRIBUTION ASSEMBLY AND COOLING SYSTEM INCLUDING THE SAME

CROSS-REFERENCE TO RELATED APPLICATIONS

This non-provisional application claims priority under 35 U.S.C. § 119(a) on Patent Application No(s). 111117133 filed in R.O.C.(Taiwan) on May 6, 2022, the entire contents of which are hereby incorporated by reference.

TECHNICAL FIELD

The disclosure relates to a cooling device, more particularly to a fluid distribution assembly and cooling system including the same.

BACKGROUND

With the rapid growth of technology, especially in the era that has large demand in internet, artificial intelligence, and cloud services, the data centers constantly need to process a massive amount of data. In order to maintain or improve the efficiency of the data centers. It is necessary to continuously and effectively remove heat generated by the data centers. As the power density of the data center increases, the conventional heat dissipation means enhances power or are scaled up to deal with the increasing heat, but these solutions are power-consuming and result in greatly increase cost and impact on the environment.

Therefore, in recent years, liquid-cooling techniques, such as immersion cooling have gradually gained attention. Specifically, immersion cooling is to immerse heat sources, such as CPU, mainboard, and other associated components thereon, into a dielectric coolant, the coolant is in direct thermal contact with these components so that the immersion cooling is much more efficient than air cooling. Also, immersion cooling does not require fan, which helps reduce the power consumption, cost, operating noise, and requirement for space. With these advantages, immersion cooling gradually replaces air cooling.

Generally, there are two-phase immersion cooling and single-phase immersion cooling. The two-phase immersion cooling uses the state transition of a coolant from liquid to vapor to take away the heat generated by the heat sources, the vapor flows away from the liquid level, and then is condensed by a condenser and falls back into the liquid coolant as droplets. The single-phase immersion cooling is to fully immerse the system into a coolant bath, heat is transferred to the coolant through direct contact with the heat sources. The single-phase immersion cooling usually requires a large amount of coolant and therefore leads to a considerable cost on the coolant.

For example, please see a conventional single-phase immersion cooling device shown in FIG. 1, a stack of a heat source 68 and a heat sink 69 is accommodated in the internal space 911 of an outer casing 91 disposed on a circuit board 90, to fully immerse the heat source 68 and the heat sink 69 in a coolant 8, a liquid level 81' of the coolant 8 in the internal space 911 must be raised up to be higher than large the tallest heat source (i.e., the heat sink 69), however, filling coolant in the outer most casing to a specific height requires a large amount of the coolant 8 and thereby leading to a considerable cost on the coolant.

SUMMARY

One embodiment of the disclosure provides a fluid distribution assembly adapted for at least one heat source and including at least one housing having a coolant chamber and at least one fluid-driving component in fluid communication with the coolant chamber configured for accommodating the at least one heat source, and the at least one fluid-driving component is configured to pump fluid out of the coolant chamber.

Another embodiment of the disclosure provides a cooling system adapted for at least one heat source and comprising a tank and at least one fluid distribution assembly. The tank has an accommodation space. The tank has a tank liquid inlet and a tank liquid outlet which are located opposite to each other and in fluid communication with the accommodation space. The at least one fluid distribution assembly includes at least one housing accommodated in the accommodation space and having a coolant chamber configured for accommodating the at least one heat source and at least one fluid-driving component in fluid communication with the chamber liquid outlet of the housing. The at least one fluid-driving component is configured to pump fluid out of the coolant chamber.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein:

FIG. 4 is an exploded view of the fluid distribution assembly and a supporting board in FIG. 2;

FIGS. 5-7 show how the coolant flows in the fluid distribution assembly when the cooling system in FIG. 2 is activated;

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities. The phrase "in fluid communication with" may be used herein to describe a situation that fluid (liquid and/or gas) is allowed to directly or indirectly flow between at least two of space, area, channel, and/or opening.

Figure 2:
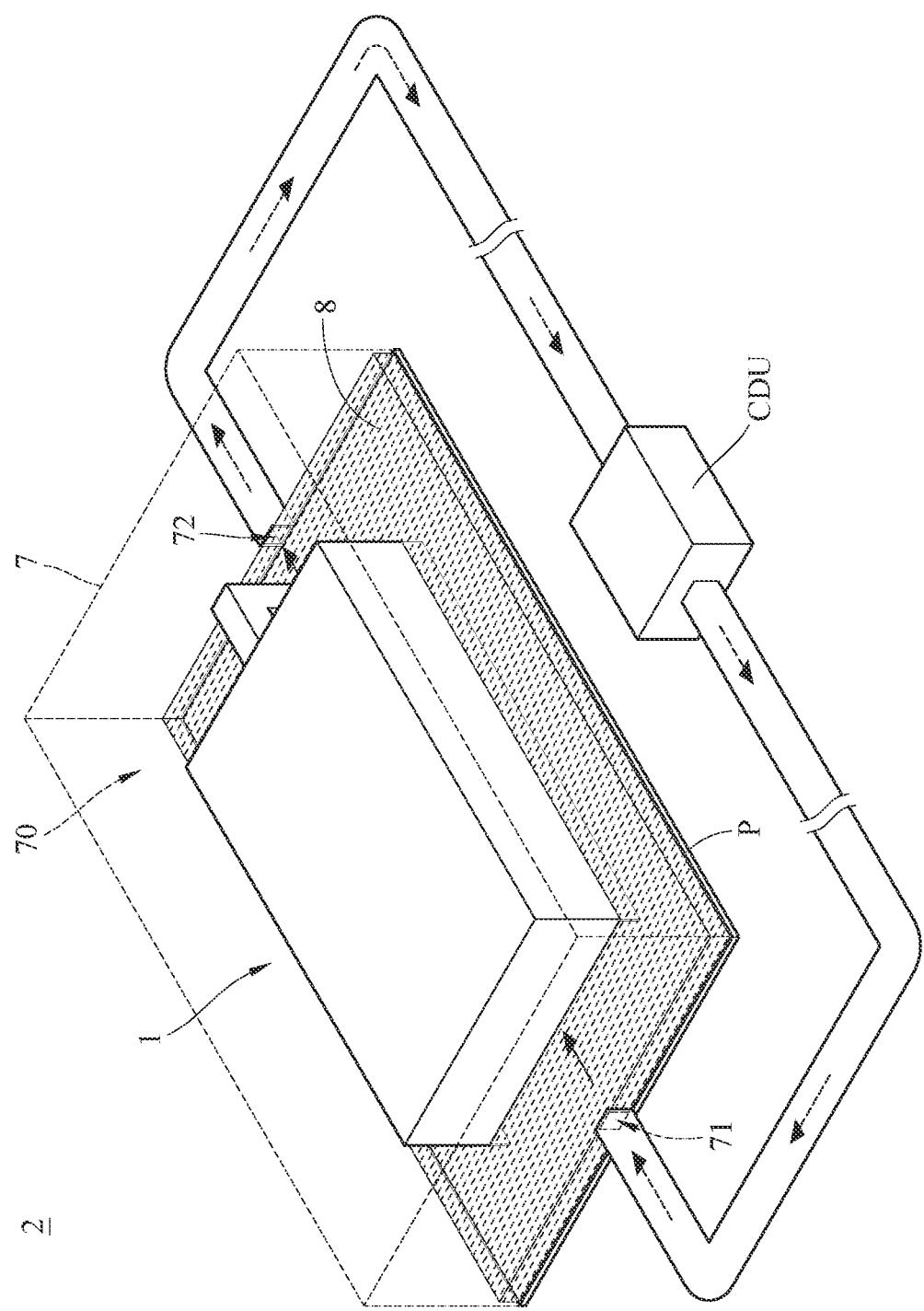
FIG. 2 is a perspective view of a cooling system according to one embodiment of the disclosure.

Please refer to FIG. 2, one embodiment of the disclosure provides a cooling system 2, the cooling system 2 may include a tank 7 and at least one fluid distribution assembly 1, the fluid distribution assembly 1 is configured to be accommodated within the tank 7, the tank 7 is configured to be connected to an external driving device. For example, the tank 7 may be in fluid communication with one or more coolant distribution units CDU via any suitable pipe (not numbered), the tank 7 receives coolant 8 from the coolant distribution unit CDU, and the coolant 8 is circulated through the tank 7, the coolant distribution unit CDU, and associated fluid channels by being driven by the coolant distribution unit CDU and therefore forms a cooling circulation. Note that the coolant distribution unit CDU is provided for better understanding the disclosure but is not intended to limit the disclosure in any aspect.

In more detail, the tank 7 may have an accommodation space 70 and a tank liquid inlet 71 and a tank liquid outlet 72 which are respectively in fluid communication with different sides of the accommodation space 70. For example, the tank liquid inlet 71 and the tank liquid outlet 72 may be in fluid communication with two opposite sides of the accommodation space 70 respectively. The accommodation space 70 means the area of the tank 7 that is configured to accommodate the fluid distribution assembly 1, the coolant 8, and other associated electrical and non-electrical elements not shown in the drawings. It is noted that the size and shape of the accommodation space 70 may be modified as required. The tank liquid inlet 71 is served to be connected to the coolant distribution unit CDU. The tank liquid inlet 71 means an opening of the tank 7 served to receive coolant 8 from outside and able to let the coolant 8 flow into the accommodation space 70. It is noted that the tank liquid inlet 71 and its size, shape, number, and position are not limiting and may be modified as required. The tank liquid outlet 72 is served to be connected to the coolant distribution unit CDU. The tank liquid outlet 72 means another opening of the tank 7 served to discharge the coolant 8 back to the coolant distribution unit CDU. It is noted that the tank liquid outlet 72 and its size, shape, number, and position are not limiting and may be modified as required.

The coolant 8 may be any suitable dielectric fluid having a boiling point below the operating temperature of the heat sources, thus the coolant 8 is suitable to be in direct thermal contact with heat source to directly absorb heat generated by the heat source and occurs state transition when heated by the heat source. It is also noted that the disclosure is not limited by the coolant 8 and its type and physical properties.

Figure 3:
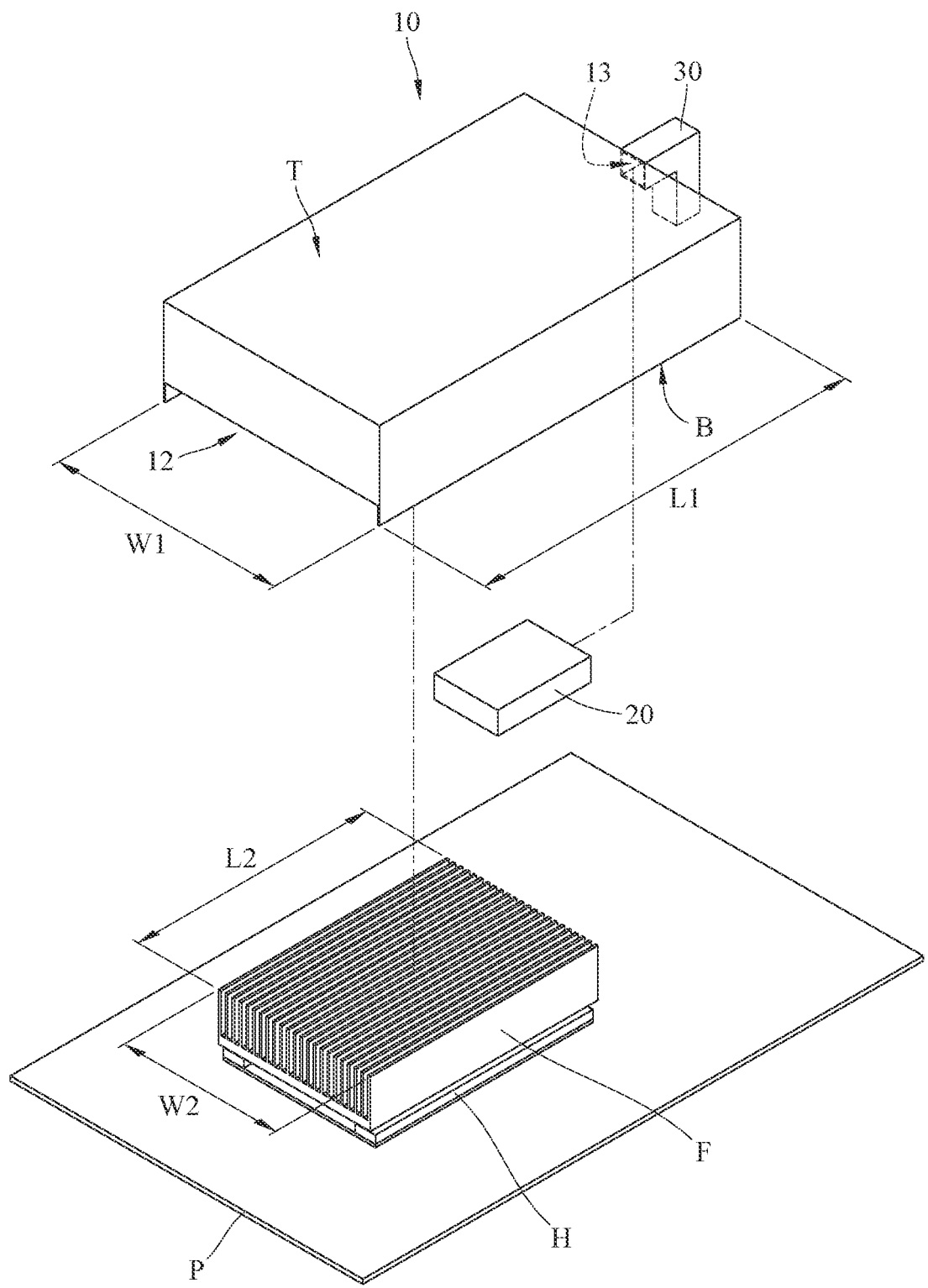
FIG. 3 is a perspective view of the fluid distribution assembly in FIG. 2.

Herein, please refer to FIG. 2 and further refer to FIGS. 3-4, the tank 7 may be disposed on a supporting board P by any suitable manner. As shown, the accommodation space 70 is defined by inner surfaces of the tank 7 and the surface of the supporting board P. In such an arrangement, the tank 7 and the supporting board P together form a hollow structure whose internal space is in fluid communication with the outside only via the tank liquid inlet 71 and the tank liquid outlet 72.

The supporting board P is employed to support required electrical/non-electrical components or modules. For example, the supporting board P may be a circuit board with one or more heat sources H thereon. The heat source H may be an electrical component needed to be cooled during operation. For example, the heat source H may be a central processing unit; however, the heat source H is provided for better understanding the disclosure but is not intended to limit the disclosure in any aspect. It is also noted that the type, number, size, and scale of the heat sources H on the supporting board P are not limiting. Optionally, there may be a heat sink F arranged on the heat source H. It is noted that any typical fin structure capable of in thermal contact the heat source H and absorbing heat generated by the heat source H can be employed as the heat sink F.

To make the coolant 8 efficiently and effectively cool the heat source H and the heat sink F supported by the supporting board P, the heat source H and the heat sink F may be accommodated within the fluid distribution assembly 1. Specifically, in this embodiment, the fluid distribution assembly 1 may include at least one housing 10 and at least one fluid-driving component 20. The housing 10 may be a hollow structure made of any suitable material. The housing 10 has a coolant chamber 11 having an opening at one side thereof. As shown, the housing 10 has an opening portion O at a side of the coolant chamber 11. Thus, the heat source H and the heat sink F can be accommodated in the coolant chamber 11 of the housing 10 when the housing 10 is disposed on the supporting board P.

In more detail, the housing 10 may further have at least one chamber liquid inlet 12 and at least one chamber liquid outlet 13 which are in fluid communication with the coolant chamber 11. An upper portion T and a lower portion B of the housing 10 may be defined for facilitating the illustration of the positions of the chamber liquid inlet 12 and the chamber liquid outlet 13 on the housing 10. The upper portion T means the portion of the housing 10 located relatively away from the supporting board P during normal use. For example, the upper portion T may be a top plate of the housing 10. The lower portion B means the portion of the housing 10 located relatively close to the supporting board P or directly in contact with the supporting board P during normal use. For example, the lower portion B may be bottom edges of side plates of the housing 10. As shown, the opening portion O may be defined by the lower portion B; in other words, the opening portion O may be defined by the bottom edges of the side plates of the housing 10. That is, the upper portion T and the opening portion O (or, the lower portion B) are two portions of the housing 10 which are located relatively away from the supporting board P and located relatively close to the supporting board P respectively.

The chamber liquid inlet 12 and the chamber liquid outlet 13 are respectively located at two opposite sides of the housing 10. In specific, the chamber liquid inlet 12 may be located at the lower portion B of the housing 10. As shown, the chamber liquid inlet 12 may be located at a side of the opening portion O; in specific, the chamber liquid inlet 12 may be an opening formed at one of the side plates of the housing 10 at the lower portion B. The chamber liquid outlet 13 may be located at or located adjacent to the upper portion T of the housing 10. In short, the chamber liquid inlet 12 and the chamber liquid outlet 13 are located opposite to each other and the chamber liquid inlet 12 is located closer to the supporting board P than the chamber liquid outlet 13, thus the chamber liquid outlet 13 is located higher than the chamber liquid inlet 12 when in normal use.

The fluid-driving component 20 may be any suitable pump. The fluid-driving component 20 may be accommodated in the coolant chamber 11 of the housing 10 and arranged adjacent to the chamber liquid outlet 13 of the housing 10. In such an arrangement, the fluid-driving component 20 is able to discharge fluid (liquid and gas) out of the coolant chamber 11 via the chamber liquid outlet 13.

Optionally, the chamber liquid outlet 13 of the housing 10 may be connected to a guide tube 30. As shown, the guide tube 30 may have a connecting end 31 and a discharging end 32 located opposite to each other. The connecting end 31 is configured to be connected to the chamber liquid outlet 13 of the housing 10 and therefore is able to receive the fluid discharged from the chamber liquid outlet 13. The discharging end 32 is configured to discharge the fluid out of the guide tube 30. In more detail, in this embodiment, part of the guide tube 30 extends towards the supporting board P so that the discharging end 32 is located closer to the supporting board P than the connecting end 31. For example, the discharging end 32 of the guide tube 30 may be horizontally aligned with the chamber liquid inlet 12 of the housing 10; more specifically, the discharging end 32 of the guide tube 30 may be horizontally aligned with a side of the chamber liquid inlet 12 of the housing 10 located away from the opening portion O. It is noted that the shape and length of the guide tube 30 are exemplary. The fluid distribution assembly in some other embodiment of the disclosure may omit the aforementioned guide tube.

Then, please refer to FIGS. 5-7, the purpose and function of the fluid distribution assembly 1 are specifically introduced with reference to the flow of the coolant 8 in the fluid distribution assembly 1 of the cooling system 2. Firstly, in FIG. 5, the objects needed to be cooled (e.g., the heat source H and the heat sink F) are arranged within the coolant chamber 11 of the housing 10 of the fluid distribution assembly 1, and more and more coolant 8 flows into the accommodation space 70 via the tank liquid inlet 71 of the tank 7. The chamber liquid inlet 12 of the housing 10 is located at the lower portion B of the housing 10 (i.e., located adjacent to the opening portion O), thus the coolant 8 flows into the coolant chamber 11 of the housing 10 via the chamber liquid inlet 12. As more and more coolant 8 flows into the accommodation space 70, a liquid level 81 of the coolant 8 will be gradually increased to be higher than the chamber liquid inlet 12 of the housing 10.

Then, in FIG. 6, the fluid-driving component 20 located at the chamber liquid outlet 13 is able to discharge gas out of the coolant chamber 11 of the housing 10 via the chamber liquid outlet 13, thereby making the pressure of the coolant chamber 11 gradually lower than the pressure outside the coolant chamber 11. The decrease in pressure of the coolant chamber 11 leads to a progressive rise of a liquid level 81' of the coolant 8 in the housing 10. During the rise of the liquid level 81' of the coolant 8, the accommodation space 70 of the tank 7 is in fluid communication with the outside, thus the part of the accommodation space 70 other than the coolant chamber 11 defined by the housing 10 is in a pressure equilibrium to that of the outside of the accommodation space 70, such that the part of the coolant 8 that is located outside the housing 10 may stay at the same liquid level 81; that is, during the rise of the liquid level 81' of the coolant 8 in the coolant chamber 11, the liquid level 81 of the coolant 8 outside the coolant chamber 11 may not change.

Figure 8:
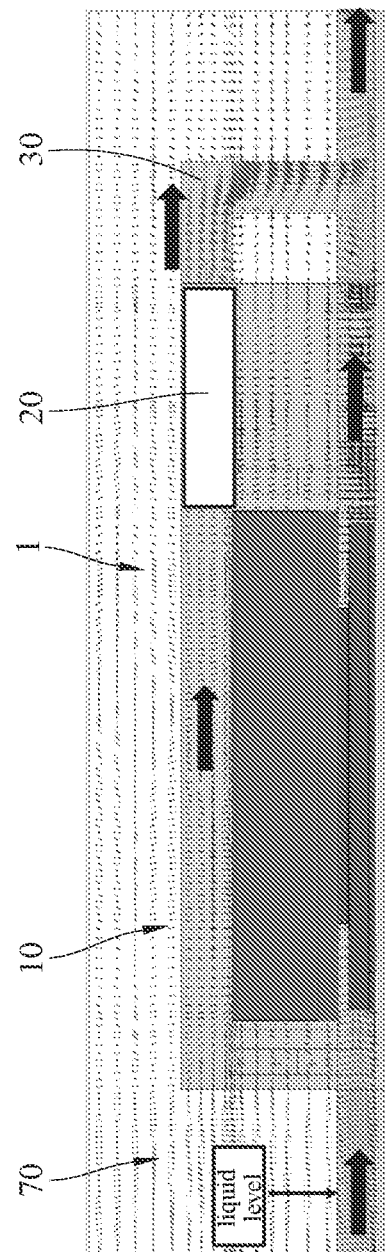
FIG. 8 shows a flow simulation of the fluid distribution assembly in FIG. 2.

Then, as the fluid-driving component 20 keeps operating, the liquid level 81' of the coolant 8 in the coolant chamber 11 will be raised to be higher than the heat source H and the heat sink F and the coolant 8 will eventually fill the coolant chamber 11. In specific, as shown in FIG. 7, taking the supporting board P as a basis line, the liquid level 81' of the coolant 8 in the coolant chamber 11 which is higher than the heat source H and the heat sink F may have a height of h1, the heat source H may have a height of h2, the heat sink F may have a height of h3, and h1 is at least higher than h2 and h3; in other words, the heat source H and the heat sink F in the coolant chamber 11 are fully immersed in the coolant 8. Also, the coolant 8 in the coolant chamber 11 may be discharged out of the housing 10 via the chamber liquid outlet 13, and the heat generated by the heat source H and the heat sink F is absorbed by the coolant 8 and removed by the flow of the coolant 8. With reference to FIG. 7 and further reference to FIG. 2, as the coolant distribution unit CDU keeps working, the coolant 8 is continuously circulated through the areas as indicated by the arrows in FIG. 7, thus the coolant 8 is able to continuously cool the heat source H and the heat sink F to form a flow field as shown in FIG. 8.

Figure 1:
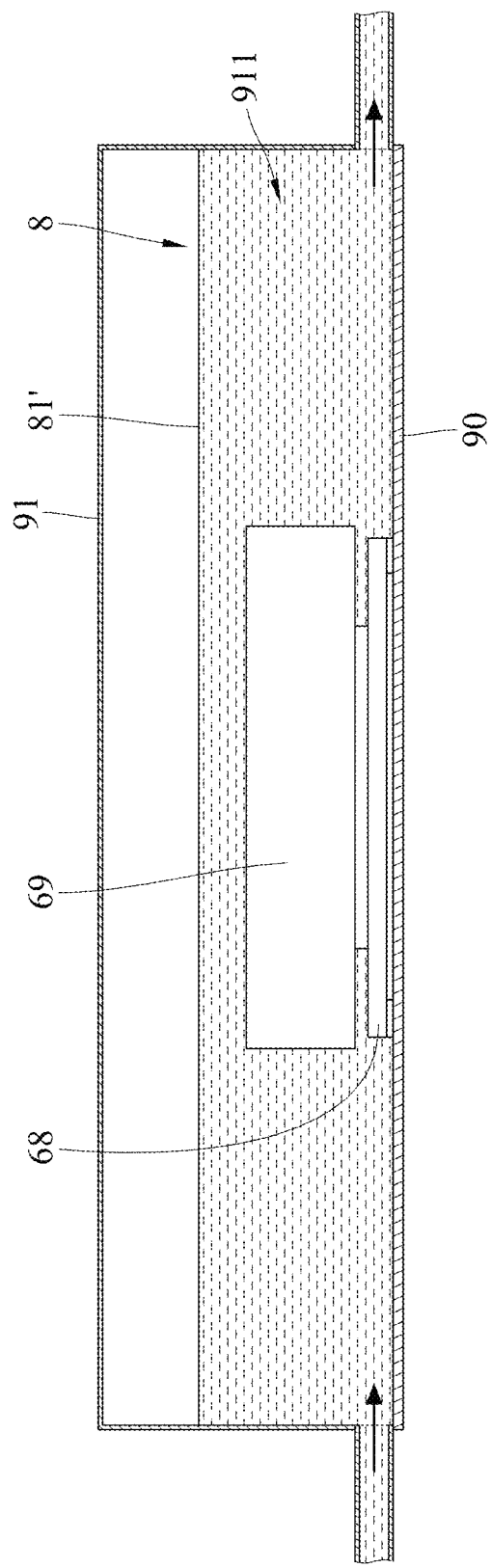
FIG. 1 is a schematic view of a conventional single-phase immersion cooling device.

In the cooling system 2, merely filling the fluid distribution assembly 1 is sufficient to effectively cool the heat source H and the heat sink F, thus the fluid distribution assembly 1 allows the cooling system 2 to achieve the required heat dissipation using a suitable volume of coolant (e.g., the volume of the coolant chamber 11 of the housing 10). In specific, comparing FIG. 1 and FIG. 7, the cooling system 2 adopting the fluid distribution assembly 1 at lease can save a volume of coolant equivalent to the volume difference between the accommodation space 70 of the tank 7 and the coolant chamber 11 of the housing 10 from the liquid level 81 to the liquid level 81'. In an exemplary case that the fluid distribution assembly 1 is accommodated in a tank 7 being a 1U 19-in rack and adopts a coolant costs $180/L, every 1 centimeter drop of the liquid level of the overall coolant in the accommodation space 70 of the tank 7 substantially saves approximately 3.74 L of the coolant (i.e., saving around 673.2 USD of the cost of coolant). In another exemplary case that the fluid distribution assembly 1 is accommodated in a tank 7 being a 2U 19-in rack and adopts a coolant costs $180/L, every 1 centimeter drop of the liquid level of the overall coolant in the accommodation space 70 of the tank 7 substantially saves approximately 20.2 L of the coolant (i.e., saving around 3636 USD of the cost of coolant). The above cases show that the fluid distribution assembly 1 make the cooling system 2 able to effectively cool the heat source therein while achieving a significant cost reduction compared to that of the prior art shown in FIG. 1.

It is noted that the size and shape of the housing 10 may be modified as required. For example, to make the heat source fully immersed in the coolant 8 in the coolant chamber 11 of the housing 10, the housing 10 may at least be higher than the heat source H or higher than the stack of the heat source H and the heat sink F. In an exemplary case that the stack of the heat source H and the heat sink F has a height of around 30 millimeters, the housing 10 may have a height of around 50 millimeters.

Optionally, to make the coolant 8 in the coolant chamber 11 of the housing 10 fully contact the heat source (e.g., the heat source H and the heat sink F), the width and length of the housing 10 may both greater than that of the heat source H or the stack of the heat source H and the heat sink F. Specifically, in FIG. 3, the housing 10 may have a width of W1 and a length of L1, the stack of the heat source H and the heat sink F may have a width of W2 and a length of L2, W1≥W2, and L1≥L2. In an exemplary cases that the stack of the heat source H and the heat sink F has a width of around 80 millimeters and a length of around 120 millimeters, the housing 10 may have a width of around 90 millimeters and a length of around 160 millimeters. In some other embodiments, the width of the housing 10 may be 1.1 times or more the width of the stack of the heat source H and the heat sink F, and the length of the housing 10 may be 1.3 times or more the length of the stack of the heat source H and the heat sink F.

Optionally, the fluid-driving component 20 used in the fluid distribution assembly 1 may be controlled using any suitable means, such as a proportional-integral-derivative controller (PID controller) or linear control system. As required as long as it is able to raise the liquid level of the coolant in the housing 10 to be higher than the stack of the heat source H and the heat sink F so as to discharge the coolant out of the chamber liquid outlet 13, the position of the fluid-driving component 20 may be modified as required. For example, in some other embodiments, the fluid-driving component 20 in the coolant chamber 11 of the housing 10 may be placed to be higher than the topmost part of the object needed to be cooled (e.g., the top edge of the heat sink F). In another embodiment, the fluid-driving component in the coolant chamber 11 of the housing 10 may be placed to be aligned with the topmost part of the object needed to be cooled (e.g., the top edge of the heat sink F).

Figure 9:
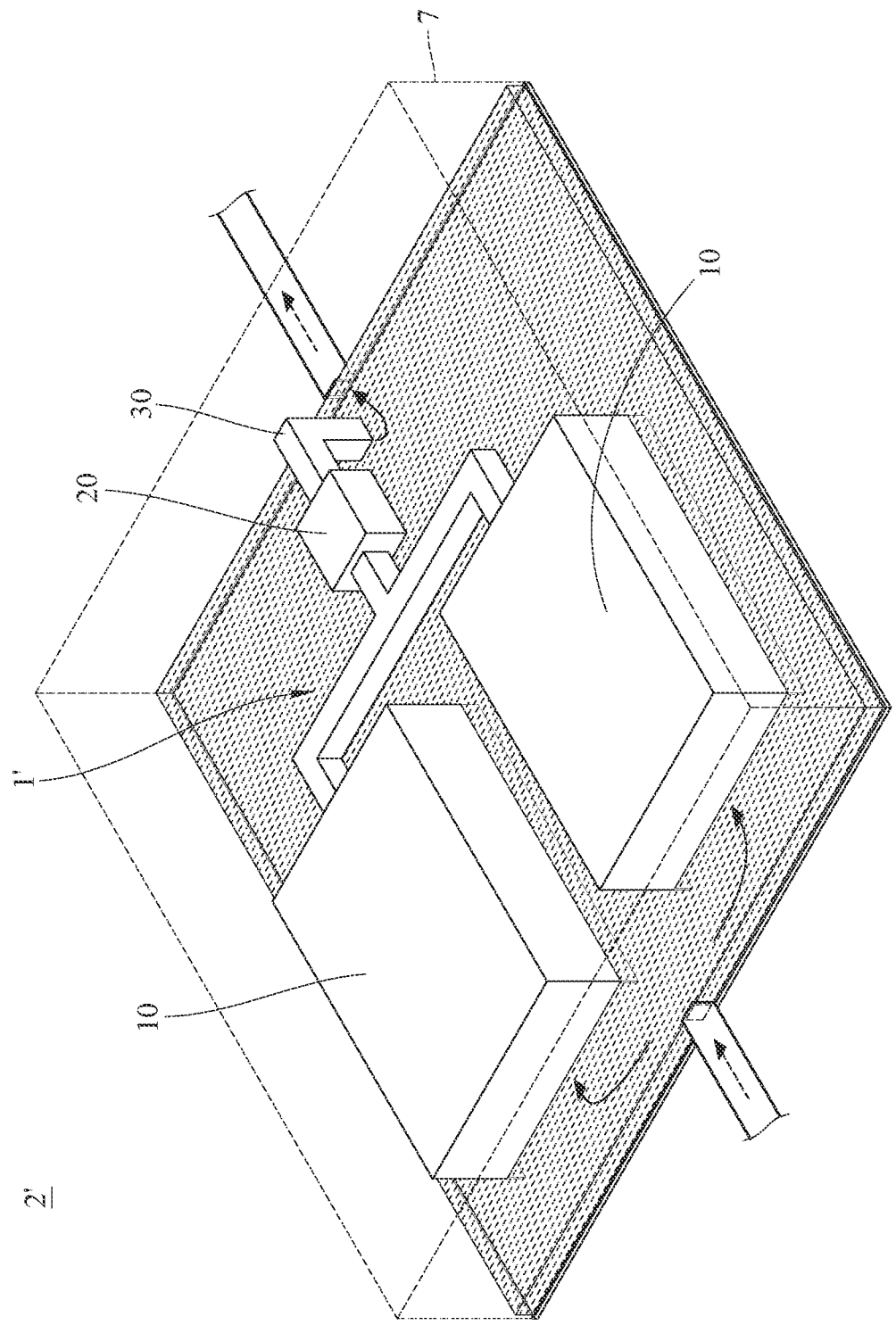
FIG. 9 is a perspective view of a cooling system according to another embodiment of the disclosure.

It is noted that the fluid-driving component may not be located within the coolant chamber of the housing and one cooling system of the disclosure may not be only cooperated with one housing. For example, please refer to FIG. 9, another embodiment of the disclosure provides a cooling system 2' which includes a fluid distribution assembly 1' with an arrangement of two housings 10 cooperated with one fluid-driving component 20. In specific, as shown, the fluid distribution assembly 1' accommodated in the tank 7 of the cooling system 2' may include at least two housings 10, the housings 10 may respectively accommodate different heat sources (not shown), and the housings 10 may be connected with the same fluid-driving component 20. In such an arrangement, the fluid-driving component is still able to draw air out of the housings 10 so as to raise the liquid level of the coolant in the housings 10 to be higher than the respective heat sources, thereby achieving effective cooling for the heat sources with a lesser amount of coolant.

The fluid distribution assembly of the disclosure may be specifically designed for cooling one or more heat sources in other form and arrangement. For example, in some other embodiments, the housing of the fluid distribution assembly may have a shape and size suitable for accommodating and cooling a graphics processor and associated heat sink thereon by the similar manner as discussed above.

In addition, the positions of the chamber liquid inlet and the chamber liquid outlet on the housing may be modified as required as long as coolant can be drawn into one side of the housing and discharged out from the other side of the housing. For example, in some other embodiments, the chamber liquid inlet may be arranged at the lower portion of the housing (e.g., arranged adjacent to a side of the opening portion), and the chamber liquid outlet may be arranged at the top plate of the housing (e.g., arranged adjacent to a side of the top plate of the housing).

According to the fluid distribution assembly and cooling system including the same as discussed in the above embodiments of the disclosure, due to the arrangement of the chamber liquid inlet, the chamber liquid outlet, and the fluid-driving component on the housing of the fluid distribution assembly, merely filling the fluid distribution assembly will be sufficient to effectively cool the heat source and heat sink. Thus, the cooling system including the fluid distribution assembly is able to effectively cool the heat source and heat sink with an appropriate amount of coolant. In specific, compared to the conventional cooling system that simply immerses the heat source in its outermost casing, the cooling system adopting the fluid distribution assembly at lease saves a volume of coolant equivalent to the volume difference between the accommodation space of the tank and the coolant chamber of the housing from the liquid level to the liquid level. As such, the fluid distribution assembly provides a cost-effective and cost-saving approach which makes the cooling system effectively cool the heat source therein while achieving a significant cost reduction compared to that of the conventional cooling system.

Also, the size, number, and arrangement of the housing of the fluid distribution assembly and the fluid-driving component thereon may be modified according to the actual requirements, which makes the fluid distribution assembly easily fit into any existing system; that is, the fluid distribution assembly of the disclosure is flexible and suitable for a broad range of applications.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A fluid distribution assembly, adapted for at least one heat source, comprising:
    at least one housing having a coolant chamber configured for accommodating the at least one heat source; and
    at least one fluid-driving component in fluid communication with the coolant chamber and configured to pump fluid out of the coolant chamber;
    wherein the at least one housing has an upper portion, an opening portion, a chamber liquid inlet, and a chamber liquid outlet, the upper portion and the opening portion are located opposite to each other, the chamber liquid outlet and the chamber liquid inlet are in fluid communication with the coolant chamber and are respectively located adjacent to the upper portion and the opening portion, and the entirety of the chamber liquid outlet is farther from the opening portion than the chamber liquid inlet in an opening direction of the opening portion;
    wherein the fluid distribution assembly further comprises a guide tube connected to the chamber liquid outlet, the guide tube comprises a connecting end and a discharging end located opposite to each other, the discharging end is connected to the chamber liquid outlet via the connecting end, and a horizontal height of the discharging end of the guide tube is equal to a horizontal height of an upper edge of the chamber liquid inlet.

2. The fluid distribution assembly according to claim 1, wherein the at least one fluid-driving component is in fluid communication with the chamber liquid outlet and configured to pump fluid out of the coolant chamber via the chamber liquid outlet.

3. The fluid distribution assembly according to claim 2, wherein the at least one fluid-driving component is located in the coolant chamber of the at least one housing.

4. The fluid distribution assembly according to claim 3, wherein the at least one fluid-driving component is directly connected to the chamber liquid outlet.

5. The fluid distribution assembly according to claim 1, wherein the at least one fluid-driving component is located outside the at least one housing.

6. The fluid distribution assembly according to claim 2, wherein the at least one housing comprises a plurality of housings, the chamber liquid outlets of the plurality of housings are all connected to the at least one fluid-driving component.

7. A cooling system, adapted for at least one heat source, comprising:
   a tank having an accommodation space, wherein the tank has a tank liquid inlet and a tank liquid outlet which are located opposite to each other and in fluid communication with the accommodation space; and
   at least one fluid distribution assembly comprising:
   at least one housing accommodated in the accommodation space and having a coolant chamber configured for accommodating the at least one heat source; and
   at least one fluid-driving component in fluid communication with the coolant chamber of the at least one housing and configured to pump fluid out of the coolant chamber;
   wherein the at least one housing has an upper portion, an opening portion, a chamber liquid inlet, and a chamber liquid outlet, the upper portion and the opening portion are located opposite to each other, the chamber liquid outlet and the chamber liquid inlet are in fluid communication with the coolant chamber and are respectively located adjacent to the upper portion and the opening portion, and the entirety of the chamber liquid outlet is farther from the opening portion than the chamber liquid inlet in an opening direction of the opening portion;
   wherein the at least one fluid distribution assembly further comprises a guide tube connected to the chamber liquid outlet, the guide tube comprises a connecting end and a discharging end located opposite to each other, the discharging end is connected to the chamber liquid outlet via the connecting end and extends towards the supporting board, and a horizontal height of the discharging end of the guide tube is equal to a horizontal height of an upper edge of the chamber liquid inlet.

8. The cooling system according to claim 7, wherein the at least one fluid-driving component is in fluid communication with the chamber liquid outlet and configured to pump fluid out of the coolant chamber via the chamber liquid outlet.

9. The cooling system according to claim 8, further comprising a supporting board, wherein the tank is disposed on the supporting board, the chamber liquid inlet is located closer to the supporting board than the chamber liquid outlet.

10. The cooling system according to claim 9, wherein the chamber liquid inlet is located closer to the supporting board than the at least one fluid-driving component.

11. The cooling system according to claim 8, wherein the at least one fluid-driving component is located in the coolant chamber of the at least one housing.

12. The cooling system according to claim 11, wherein the at least one fluid-driving component is directly connected to the chamber liquid outlet.

13. The cooling system according to claim 7, wherein the at least one fluid-driving component is located outside the at least one housing.

14. The cooling system according to claim 8, wherein the at least one housing comprises a plurality of housings accommodated in the tank, and the chamber liquid outlets of the plurality of housings are all connected to the at least one fluid-driving component.

* * * * *